(12) United States Patent
Jun et al.

(10) Patent No.: US 6,911,397 B2
(45) Date of Patent: Jun. 28, 2005

(54) METHOD OF FORMING DUAL DAMASCENE INTERCONNECTION USING LOW-K DIELECTRIC

(75) Inventors: Jin-Won Jun, Seoul (KR); Young-Wug Kim, Seoul (KR); Tae-Soo Park, Sungnam-shi (KR); Kyung-Tae Lee, Gwacheon-shi (KR)

(73) Assignee: Samsung Electronics, Co., Ltd. (KR)

( * ) Notice: Subject to any disclaimer, the term of this patent is extended or adjusted under 35 U.S.C. 154(b) by 258 days.

(21) Appl. No.: 10/412,522

(22) Filed: Apr. 11, 2003

(65) Prior Publication Data

US 2003/0199169 A1 Oct. 23, 2003

(30) Foreign Application Priority Data

Apr. 17, 2002 (KR) ........................................ 2002-20887

(51) Int. Cl.[7] ............................................. H01L 21/311
(52) U.S. Cl. ........................................ 438/700; 438/703
(58) Field of Search ................................. 438/700, 703

(56) References Cited

U.S. PATENT DOCUMENTS

| | | | |
|---|---|---|---|
| 5,753,967 A | * 5/1998 | Lin | 257/635 |
| 6,063,711 A | 5/2000 | Chao et al. | 438/724 |
| 6,077,773 A | * 6/2000 | Lin | 438/637 |
| 6,140,226 A | 10/2000 | Grill et al. | 438/637 |
| 6,153,511 A | 11/2000 | Watatani | 438/623 |
| 6,300,235 B1 | 10/2001 | Feldner et al. | 438/618 |
| 6,603,204 B2 | 8/2003 | Gates et al. | 257/760 |
| 6,613,666 B2 | 9/2003 | Ma | 438/637 |
| 6,696,222 B2 | 2/2004 | Hsue et al. | 430/313 |
| 2002/0025670 A1 | 2/2002 | Miyata | 438/637 |
| 2003/0008490 A1 | 1/2003 | Xing et al. | 438/622 |
| 2003/0044725 A1 | * 3/2003 | Hsue et al. | 430/314 |
| 2003/0119307 A1 | 6/2003 | Bekiaris et al. | 438/638 |

FOREIGN PATENT DOCUMENTS

KR 2000-29195 5/2000 ............ C09K/3/10

* cited by examiner

Primary Examiner—Lan Vinh
Assistant Examiner—Lynette T. Umez-Eronini
(74) Attorney, Agent, or Firm—Mills & Onello LLP

(57) ABSTRACT

A method of forming a dual damascene interconnection employs a low-k dielectric organic polymer as an insulating layer. With only one hard mask layer, ashing damage to the insulating layer is prevented using a hard mask layer and an etch-stop layer that are different in etch rate from that of a self-aligned spacer. Further, it is possible to form a via hole that is smaller than the resolution limit of the photolithographic process. As a result, the process is simplified and a photoresist tail phenomenon does not occur.

16 Claims, 17 Drawing Sheets

METHOD OF FORMING DUAL DAMASCENE INTERCONNECTION USING LOW-K DIELECTRIC

FIELD OF THE INVENTION

The present invention relates to a method of forming a multilevel interconnection and, more particularly, to a method of forming a dual damascene interconnection using a low-k dielectric.

BACKGROUND OF THE INVENTION

As transistors are becoming more highly integrated, logic devices trend toward high speed and high integration. With high integration of the transistors, interconnections are increasingly minimized in dimension. Such minimization results in interconnection delay and impediment to high speed operation of the devices.

Rather than aluminum alloy (Al-alloy), copper (Cu) has recently become the interconnection material choice because of its lower resistivity and higher electromigration (EM) resistance properties. However, since it is difficult to etch Cu and since Cu is readily oxidized during an oxidation process, a damascene process is used to form Cu interconnections. According to the damascene process, an interconnection groove where an upper interconnection is to be formed and a via hole connecting the upper interconnection to a lower interconnection or a substrate are formed in an insulating layer. After filling the interconnection groove and the via hole with Cu, chemical mechanical polishing (CMP) is carried out to planarize the above structure. In this manner, the damascene process is a form of filling process.

A low-k dielectric makes it possible to lower the resulting parasitic capacitance between interconnections, enhance device operating speed, and suppress the crosstalk phenomenon. In view of these advantages, the low-k dielectric is being developed in various ways. Generally, the low-k dielectric is classified into a silicon dioxide ($SiO_2$) group organic polymer and a carbon (C) group organic polymer.

A conventional damascene process using a single hard mask layer will now be described with reference to FIG. 1.

Referring to FIG. 1, a lower etch-stop layer 105, a lower insulating layer 110, an upper etch-stop layer 115, an upper insulating layer 120, and a hard mask layer 125 are sequentially stacked on a lower conductive layer 100. The hard mask layer 125, the upper insulating layer 120, the upper etch-stop layer 115, and the lower insulating layer 110 are successively etched to form a via hole 135 exposing the lower etch-stop layer 105. In the drawings, reference symbol "$D_1$" denotes the width of the via hole.

Next, a photoresist pattern 140 with an opening having the width of an interconnection groove is formed. In the drawings, reference symbol "$D_2$" denotes the width of an interconnection. Although not shown in the drawings, an interconnection groove is formed using the photoresist pattern 140 to form a damascene pattern.

In the case where the lower and upper insulating layers 110 and 120 are formed of a low-k dielectric that is an organic polymer, they tend to be damaged by oxygen plasma that is used in an ashing process, for the photoresist pattern 140. In addition, when a rework process is employed wherein a photoresist pattern is removed so as to re-perform the photolithographic process because the initial photolithographic process was incorrect, the insulating layers 110 and 120 that are already exposed at the sidewalls of the via hole can become significantly damaged.

Accordingly in the current dual damascene process that utilizes an insulating layer formed of an organic polymer, a dual hard mask layer is utilized to form an interconnection groove pattern.

FIG. 2A through FIG. 2J show the conventional steps of forming a dual damascene pattern in an insulating layer made of organic polymer using a dual hard mask layer.

Referring to FIG. 2A, a lower etch-stop layer 205, a lower insulating layer 210, an upper etch-stop layer 215, an upper insulating layer 220, a lower hard mask layer 225, and an upper hard mask layer 230 are sequentially stacked on a lower conductive layer 200.

Referring to FIG. 2B, a photoresist pattern 235 with an opening having an interconnection groove width $D_2$ is formed on the upper hard mask layer 230. Using the photoresist pattern 235 as an etching mask, the upper hard mask layer 230 is patterned to form an interconnection groove opening 233 exposing a surface of the lower hard mask layer 225.

Referring to FIG. 2C, the photoresist pattern 235 is removed by an ashing process. The interconnection groove opening 233 is disposed at the upper hard mask layer 230.

Referring to FIG. 2D, a photoresist pattern 240 with an opening having a via hole width is formed on the exposed lower hard mask layer 225. A misalignment may occur in a photolithographic process for forming the photoresist pattern 240, and a photoresist tail 241 may occur after the photolithographic process. The photoresist tail 214 results from a lack of depth of focus (DOF) margin, which is caused by a step difference of the patterned upper hard mask layer 230. The photoresist tail 241 leads to an incorrect pattern, which can prevent formation of a stable damascene structure. In a worst case scenario, a pattern may not be formed.

Referring to FIG. 2E, using the photoresist pattern 240 as an etching mask, the lower hard mask layer 225 is patterned to expose a surface of the upper insulating layer 220.

Referring to FIG. 2F, using the lower hard mask layer 225 as an etching mask, the upper insulating layer 220 is selectively etched to form a hole opening 243 exposing a surface of the upper etch-stop layer 215. Note that the upper insulating layer 220 formed of organic polymer is in the same carbon group as the photoresist pattern 240. Since their etching rates are similar to each other, the photoresist pattern 240 is also removed while etching the upper insulating layer 220.

Referring to FIG. 2G, using the patterned upper hard mask layer 230 as an etching mask, the lower hard mask layer 225 and the exposed upper etch-stop layer 215 are etched to expose an upper side of the upper insulating layer 220 adjacent to the upper portion of the hole opening 243 and the lower insulating layer 210 at a lower portion of the hole opening 243.

Referring to FIG. 2H, the exposed upper insulating layer 220 and the exposed lower insulating layer 210 are patterned to form an interconnection groove 245 in the upper insulating layer as well as a via hole 250 in the lower insulating layer. The interconnection groove 245 is wider than the via hole 250, as shown.

Referring to FIG. 2I, the lower etch-stop layer 205 at a lower portion of the via hole 250 is removed to expose a surface of the lower conductive layer 200. At this time, the upper hard mask layer 230 and the exposed etch-stop layer 215 at a lower portion of the interconnection groove 245 may also be removed.

Referring to FIG. 2J, after filling the interconnection groove 245 and the via hole 250 with conductive material, CMP is carried out to form an interconnection 260. Prior to filling the interconnection groove 245 and via hole 250, an optional barrier metal layer 255 may be formed, as shown.

The damascene process using the above dual hard mask layer is relatively complex. Further, as explained above described, this damascene process commonly results in misalignment or the formation of a photoresist tail.

SUMMARY OF THE INVENTION

The present invention is directed to a method of forming a dual damascene interconnection using only a single hard mask layer, thereby simplifying the fabrication process, while protecting an insulating layer formed of organic polymer from ashing damage.

The present invention is further directed to a method of forming a dual damascene interconnection which can form a via hole that is smaller in width than the resolution of the photolithographic apparatus.

The present invention is further directed to a method of forming a dual damascene interconnection without generating a photoresist tail that is commonly caused by a step difference.

In this manner, the present invention comprises a method of forming a dual damascene interconnection. A lower insulating layer, an upper etch-stop layer, an upper insulating layer, and a hard mask layer are sequentially formed on a semiconductor substrate where a lower conductive layer is formed. The hard mask layer and the upper insulating layer are patterned to form an interconnection groove in the upper insulating layer, the interconnection groove exposing a portion of the upper etch-stop layer. A spacer is formed on a sidewall of the interconnection groove. A photoresist pattern is formed having an opening that exposes the interconnection groove and the portion of the upper etch-stop layer. The upper etch-stop layer and the lower insulating layer are successively etched to form a hole in the lower insulating layer, the hole exposing a portion of the lower conductive layer. The patterned hard mask layer and the spacer are removed. An interconnection is then formed to fill the interconnection groove and the hole.

In one embodiment, the lower and upper insulating layers comprise a low-k dielectric organic polymer. The lower and upper insulating layers comprise a material selected from the group consisting of fluorine-doped oxide, carbon-doped oxide, and silicon oxide. The hard mask layer comprises a material having an etch rate that is identical to that of the spacer, but is different from that of the upper etch-stop layer, for example, the hard mask layer and the spacer comprise silicon nitride and the upper etch-stop layer comprises silicon oxide.

In another embodiment, a lower etch-stop layer is formed on the lower conductive layer, wherein the lower etch-stop layer is removed while removing the patterned hard mask layer and the spacer. The lower etch-stop layer may comprise a material having an etch rate that is identical to that of the hard mask layer.

In another embodiment, forming the interconnection groove comprises: forming a photoresist pattern on the hard mask layer, the photoresist pattern exposing a portion of the hard mask layer; using the photoresist pattern as an etching mask, etching the exposed hard mask layer to form a hard mask layer pattern exposing a portion of the upper insulating layer; and using the hard mask layer pattern as an etching mask, etching the exposed upper insulating layer to expose the portion of the upper etch-stop layer, wherein the photoresist pattern is removed while etching the exposed upper insulating layer.

In another embodiment, forming the hole comprises: selectively etching the upper etch-stop layer exposed by the opening to expose a portion of the lower insulating layer; and using the patterned hard mask layer, the spacer, and the upper etch-stop layer as an etching mask, selectively etching the exposed lower insulating layer to expose the portion of the lower conductive layer, wherein the photoresist pattern is removed while etching the exposed lower insulating layer.

The opening may be formed to have a first width in an interconnection groove direction that is larger than a second width in a direction crossing the interconnection groove. The opening may optionally expose a plurality of interconnection grooves.

The interconnection may be formed of a conductive material that is one selected from the group consisting of aluminum (Al), aluminum alloy (Al-alloy), copper (Cu), gold (Au), silver (Ag), tungsten (W), and molybdenum (Mo). A barrier metal layer may be formed prior to formation of the interconnection, wherein the barrier metal layer is one selected from the group consisting of Ta, TaN, TiN, WN, TaC, WC, TiSiN, and TaSiN.

The lower conductive layer may comprise a lower interconnection formed on the semiconductor substrate and the hole comprises a via hole. Alternatively, the lower conductive layer is formed on a semiconductor substrate and the hole is a contact hole.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

FIG. 3A through FIG. 3H are cross-sectional views showing the steps of forming a dual damascene interconnection according to the present invention. FIG. 4A through FIG. 4E are top plan views showing the steps of forming the dual damascene interconnection according to the present invention.

Figure 3A:
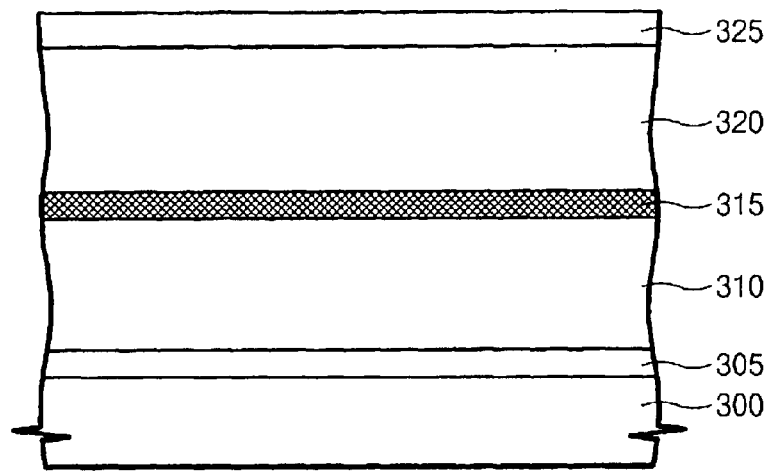
FIG. 3A through FIG. 3H are cross-sectional views illustrating the steps of forming a dual damascene interconnection according to the present invention.

Referring to FIG. 3A, a lower etch-stop layer 305, a lower insulating layer 310, an upper etch-stop layer 315, an upper insulating layer 320, and a hard mask layer 325 are sequentially stacked on a semiconductor substrate including a lower conductive layer. Here the lower conductive layer may correspond, for example, to a lower interconnection of a multilevel interconnection structure or may be formed at the semiconductor substrate.

The upper and lower insulating layers 320 and 310 have sufficient thickness to later provide the basis for an interconnection groove and a via hole (hereinafter a contact hole is also referred to as a via hole). The upper and lower insulating layers 320 and 310 may be formed of an organic polymer, or, optionally, other compounds such as fluorine-doped oxide, carbon-doped oxide, and silicon oxide. The organic polymer may comprise a low-k dielectric organic polymer such as, polyallylether-group resin, ring-shaped fluoride resin, siloxane copolymer, polyallylether-group fluoride resin, polypentafluorostylene, polytetrafluorostylene-group resin, polyimide fluoride resin, polynaphthalene fluoride resin, and polycide resin. A method of forming the same may be one selected from the group consisting of plasma enhanced chemical vapor deposition (PECVD), high density plasma chemical vapor deposition (HDCVD), atmospheric pressure chemical vapor deposition (APCVD), and spin coating.

The hard mask layer 325 and the lower etch-stop layer 305 may be formed of, for example, silicon nitride.

The upper etch-stop layer 315 is formed of a material, the etch rate of which is different from that of the hard mask layer 325 and the lower etch-stop layer 305. For example, if the hard mask layer 325 and the lower etch-stop layer 305 are formed of silicon nitride, the upper etch-stop layer 315 may be formed of silicon oxide.

Figure 3B:
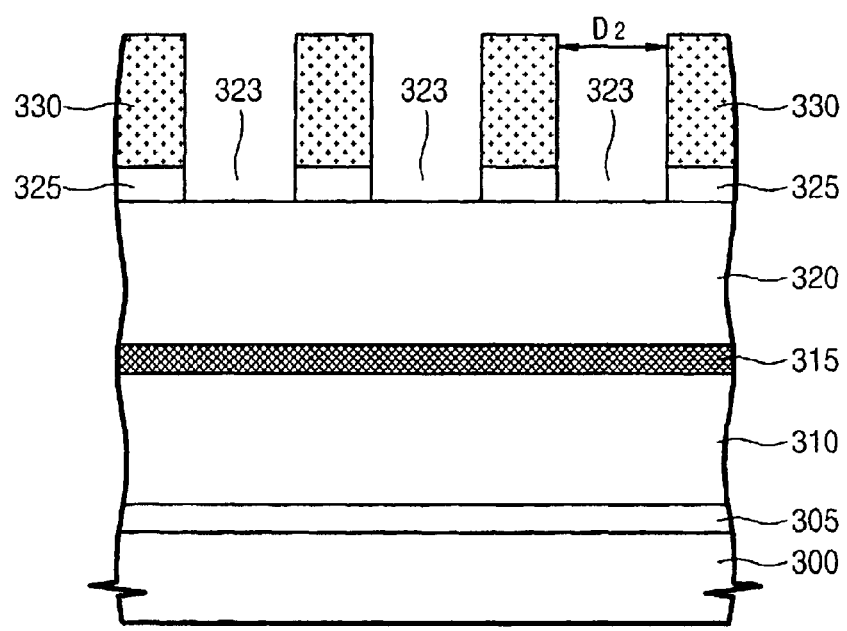

Referring to FIG. 3B, a photoresist pattern 330 with an opening having an interconnection groove width is formed on the hard mask layer 325. Using the photoresist pattern 330 as an etching mask, the hard mask layer 325 is patterned to form an interconnection groove opening 323 exposing a surface of the upper insulating layer 320. Three interconnection groove openings 323 are shown in this figure.

Figure 3C:
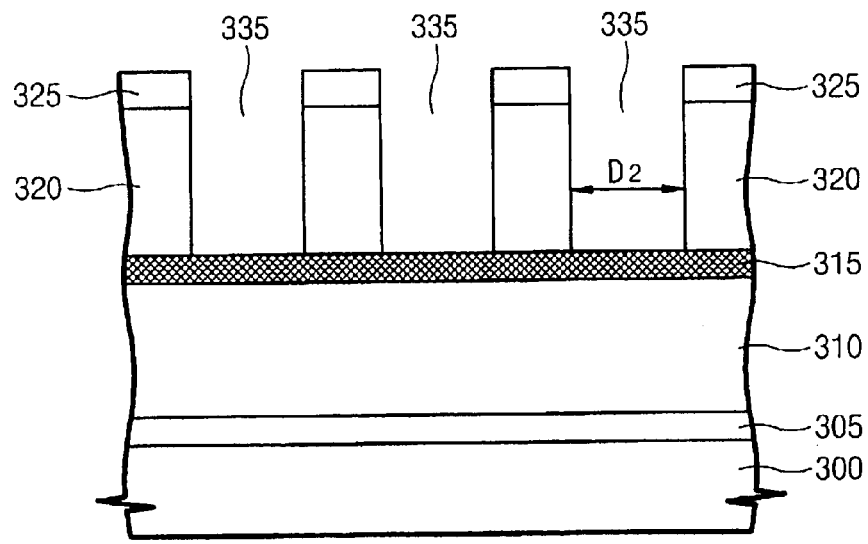

Referring to FIG. 3C, using the patterned hard mask layer 325 as an etching mask, the upper insulating layer 320 is etched down to a surface of the upper etch-stop layer 315 to form an interconnection groove 335. Note that in the case where the upper insulating layer 320 is formed of a low-k dielectric organic polymer, it is in the same carbon group as the photoresist pattern 330. Accordingly, the etch rate of the upper insulating layer 320 is similar to that of the photoresist pattern 330. Thus, the photoresist pattern 330 can be etched while etching the upper insulating layer 320.

Figure 4A:
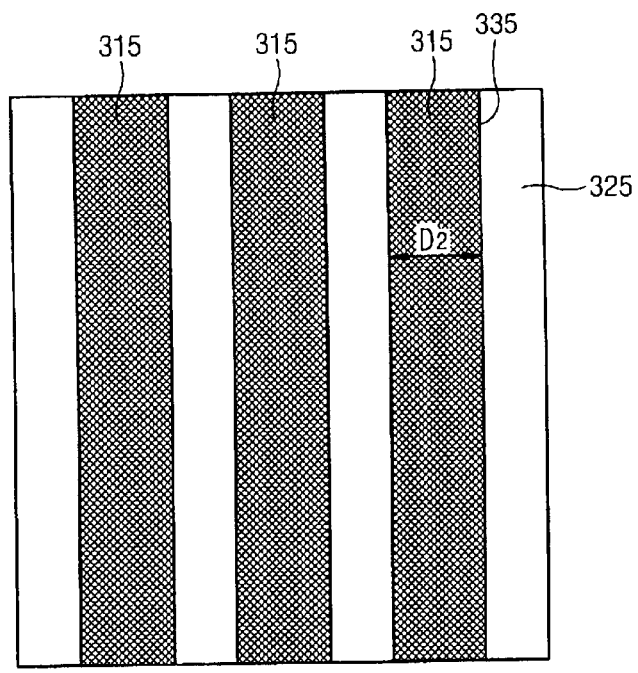
FIG. 4A through FIG. 4E are top plan views illustrating the steps of forming the dual damascene interconnection according to the present invention.

Referring to FIG. 4A, using the hard mask layer 325 as an etching mask, an interconnection groove 335 is formed to expose the upper etch-stop layer 315.

Figure 3D:
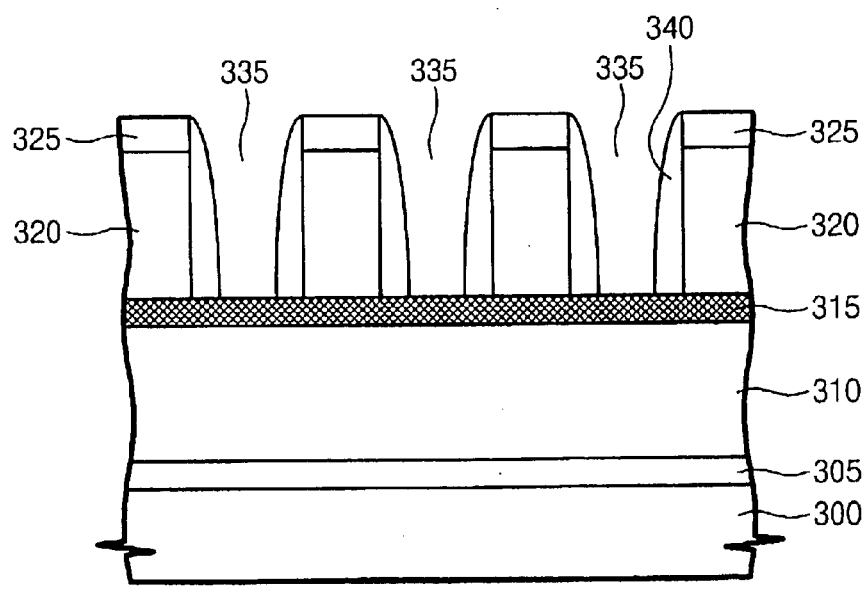

Referring to FIG. 3D, a spacer insulating layer is formed on an entire surface of the resulting structure including the interconnection groove 335. A complete etch is performed thereon to form a self-aligned spacer 340 on sidewalls of the interconnection groove 335. The spacer insulating layer is, for example, formed of a material, the etch rate, or etch selectivity, of which is identical to that of the hard mask layer 325 and the lower etch-stop layer 305, but is different from that of the upper etch-stop layer 315. For example, the spacer insulating layer may be formed of silicon nitride. Thus, the upper etch-stop layer 315 is not etched during the complete etch step used for forming the self-aligned spacer 340.

Since the width of a via hole is determined by the lower width of the spacer 340 formed on the sidewall of the interconnection groove 335, it may be adjusted by adjusting the formation thickness of the spacer 340. That is, the self-aligned spacer 340 serves to restrict the size of the via hole to a size that that is smaller than the available resolution of the photolithographic process. Further, the process of the present invention does not suffer from the limitations of the conventional approach, such as a misalignment occurring during the photolithographic process or the formation of a photoresist tail caused by a step difference, as explained above.

Figure 4B:
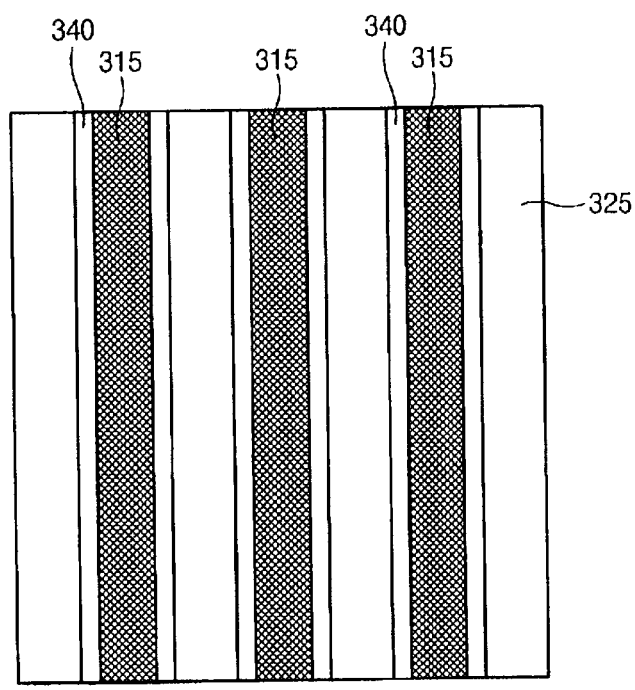

Referring to FIG. 4B, a self-aligned spacer 340 is formed on a sidewall of the interconnection groove 335.

Figure 3E:
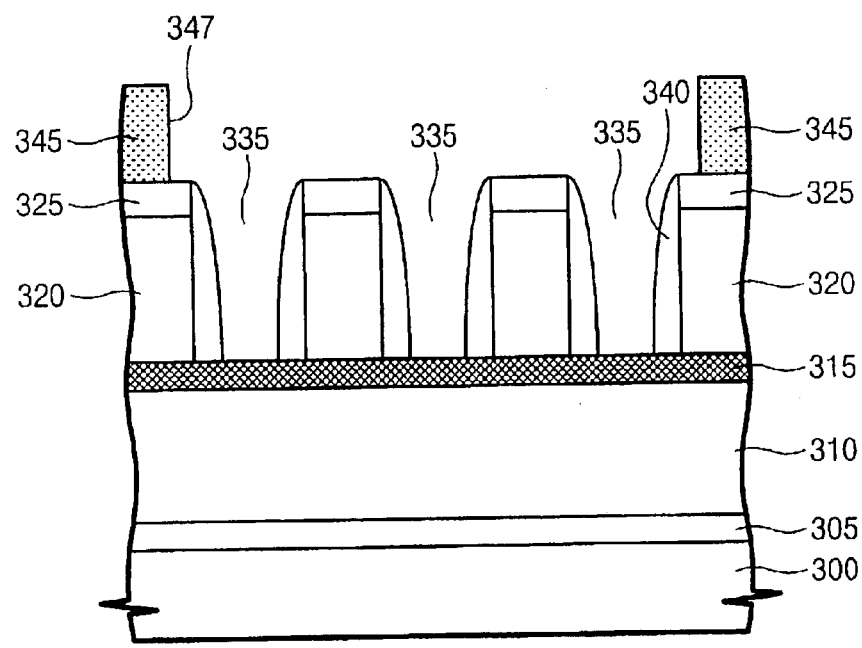

Referring to FIG. 3E, after coating a photoresist on an entire surface of a substrate, a conventional photolithographic process is carried out to form a photoresist pattern 345 with an opening 347 that exposes the interconnection groove 335. In the case where a rework is needed due to a bad pattern (or bad patterns) being formed during the photolithographic process used for forming the photoresist pattern 345, the insulating layers 310 and 320 are not damaged although they are made of organic polymer whose etch rate is similar to that of the photoresist pattern 345. This is because the insulating layers 310 and 320 are covered by the spacer 340, the hard mask layer 325, and the upper etch-stop layer 315, and are thus protected from ashing gas used in the rework. Since the photoresist pattern 345 is formed on the planarized hard mask layer 325 without a step difference in the photolithographic process, the conventional photoresist tail will not be generated.

Figure 4C:
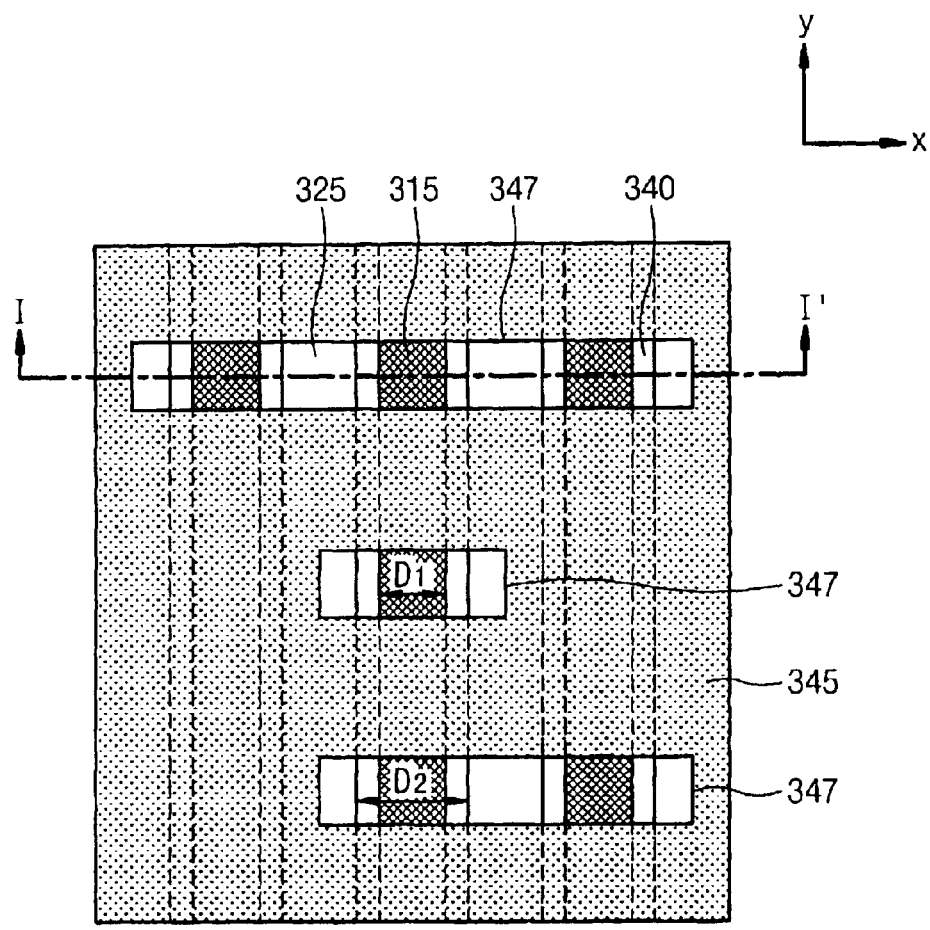

Referring to FIG. 4C, a photoresist pattern 345 with an opening 347 exposing the interconnection groove 335 is formed on a semiconductor substrate including the spacer 340.

Figure 1:
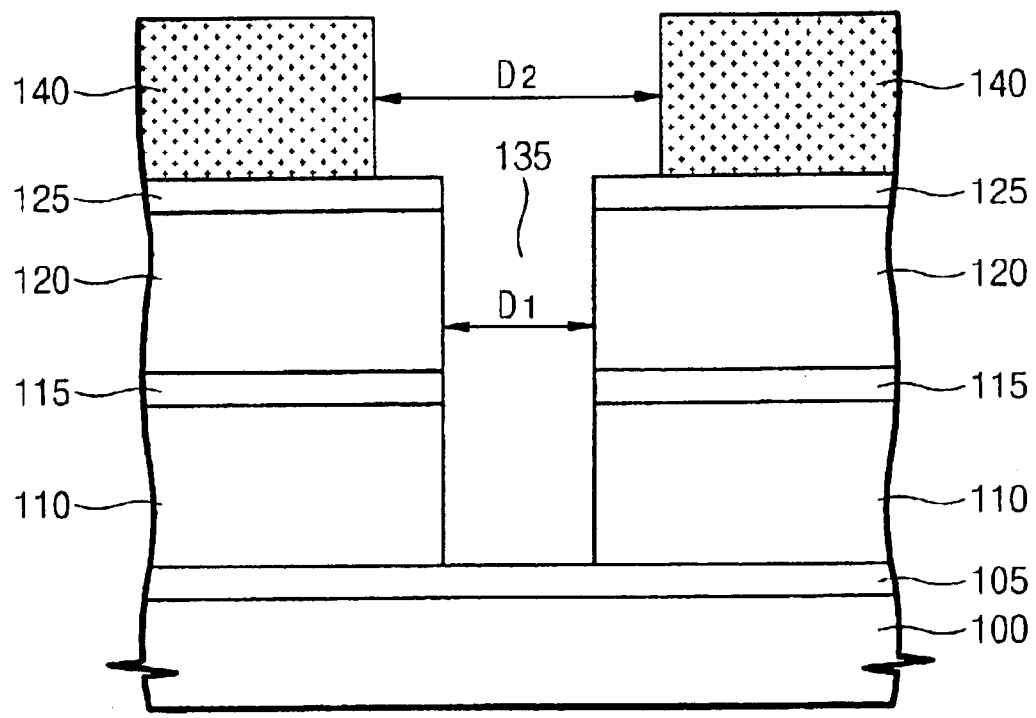
FIG. 1 is a cross-sectional view of a conventional dual damascene process using a single hard mask layer.
Figure 2A:
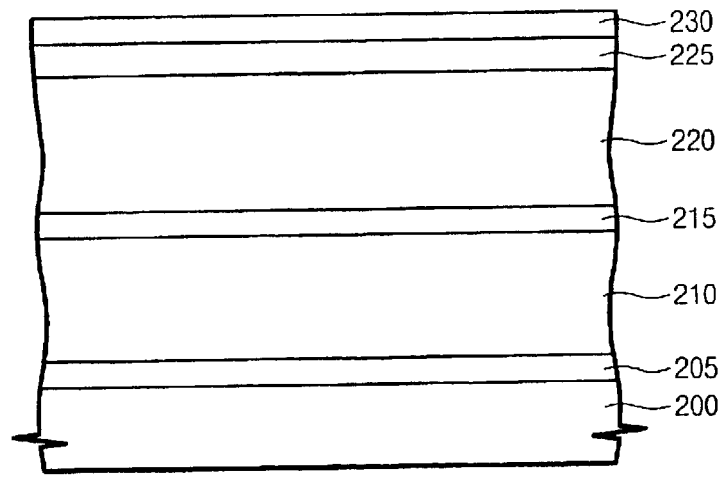
FIG. 2A through FIG. 2J are cross-sectional views of a conventional dual damascene process using a dual hard mask layer.
Figure 2B:
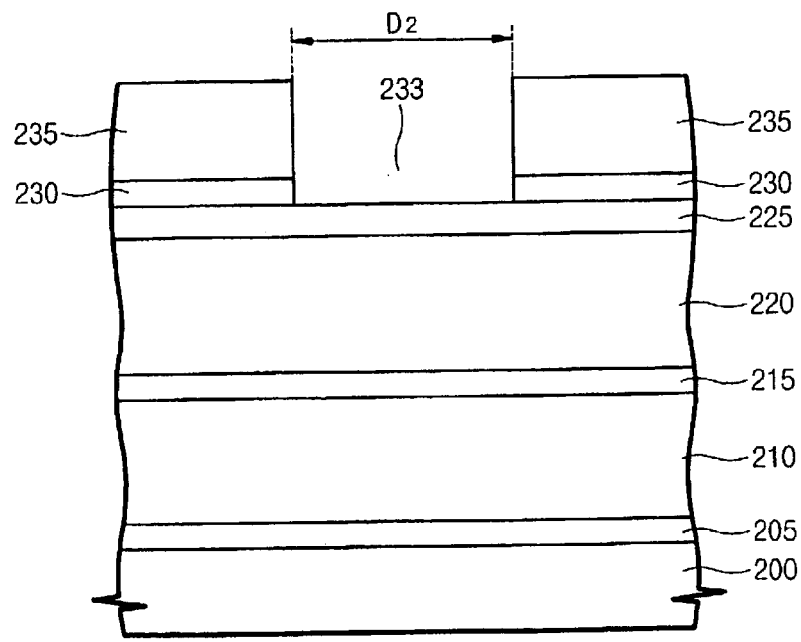
Figure 2C:
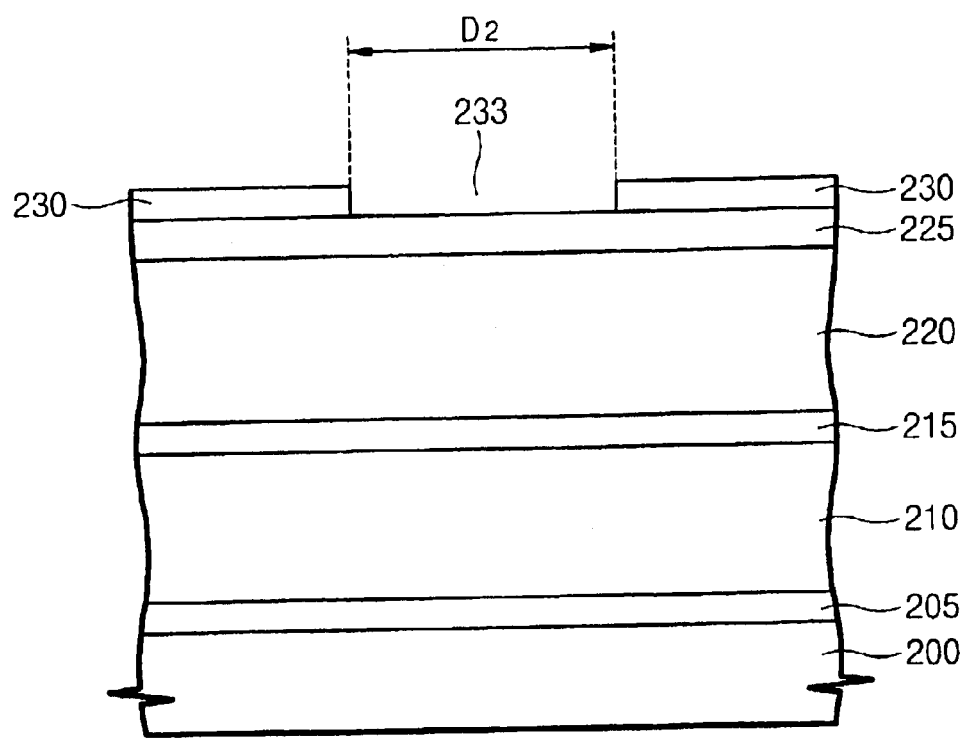
Figure 2D:
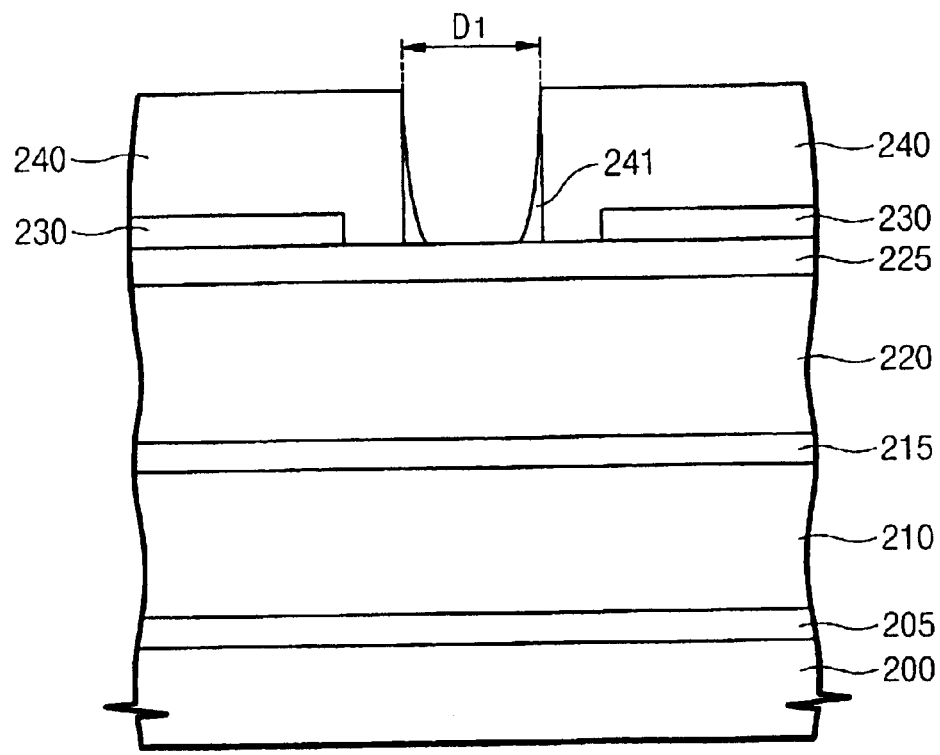
Figure 2E:
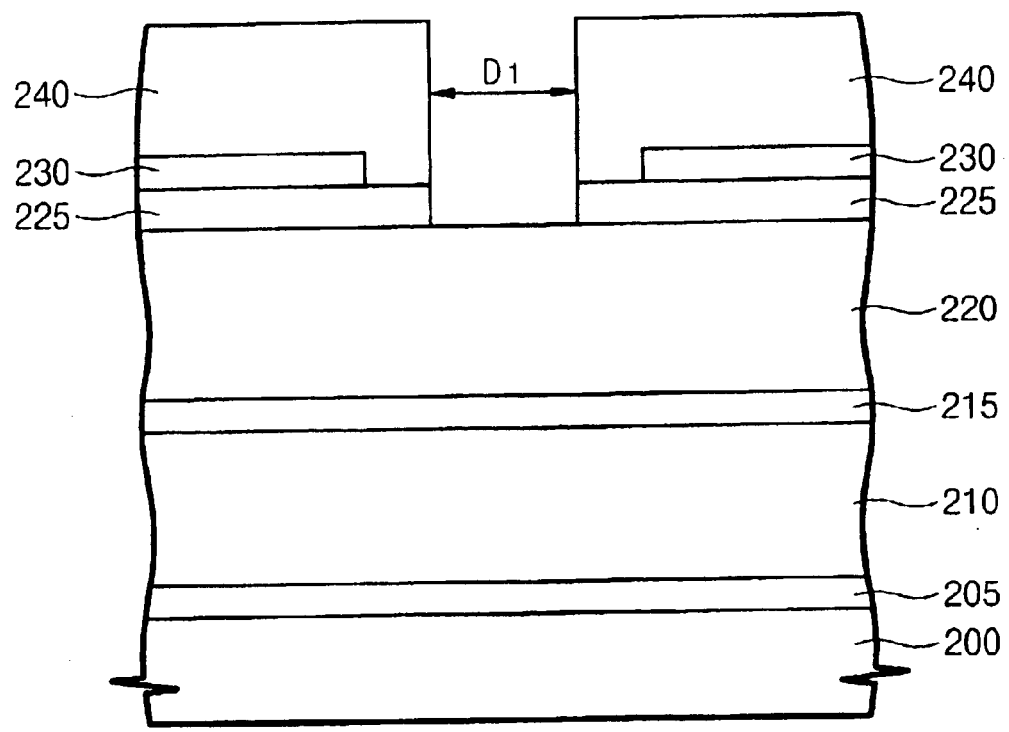
Figure 2F:
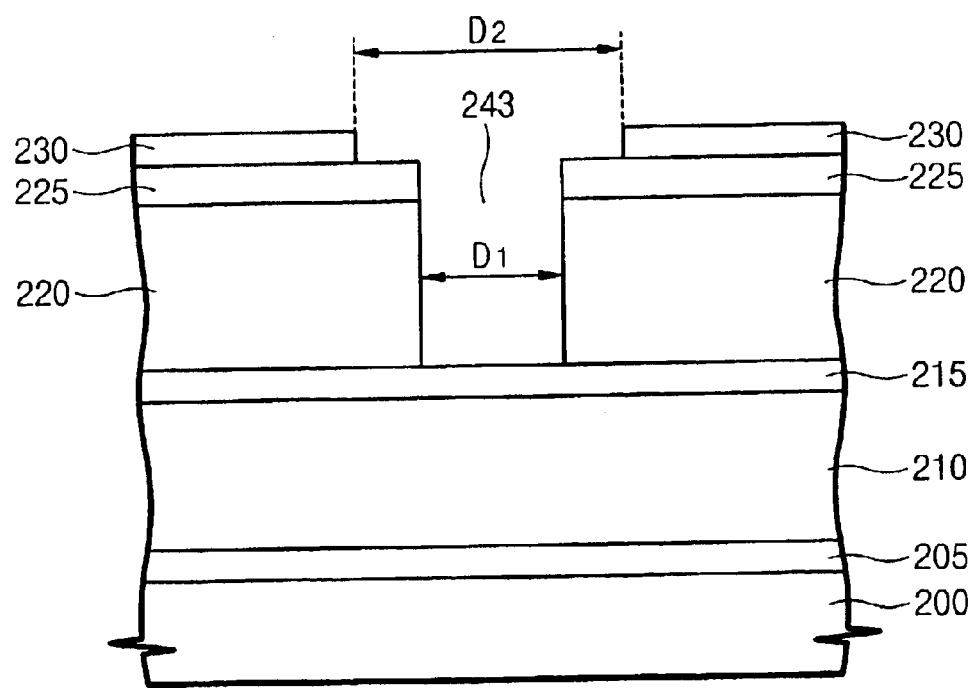
Figure 2G:
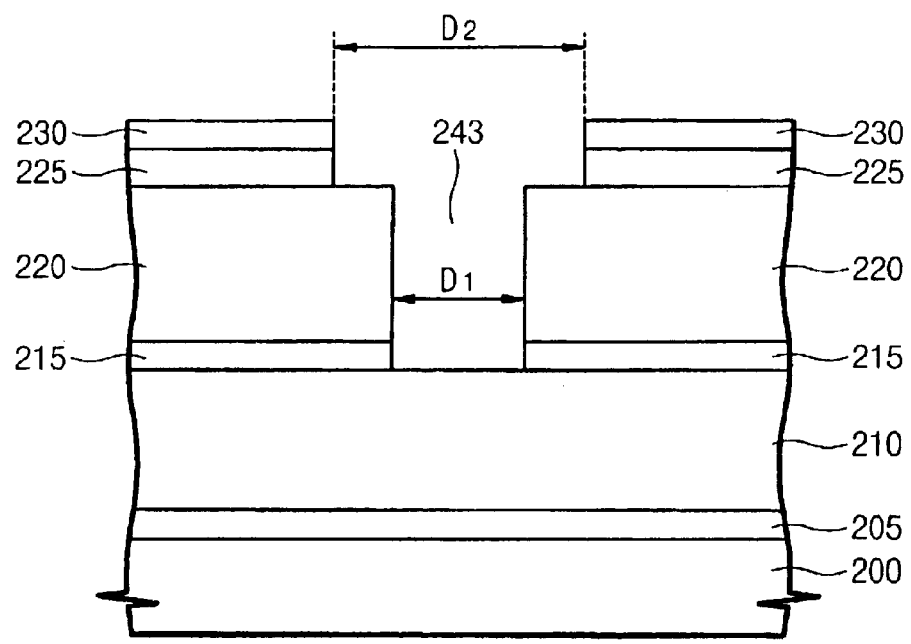
Figure 2H:
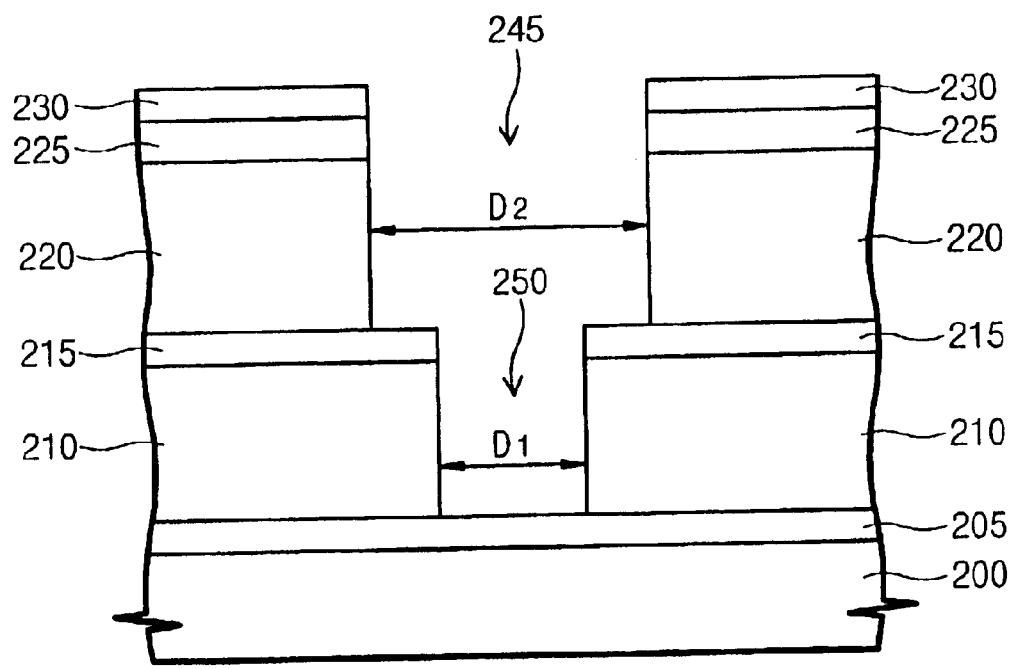
Figure 2I:
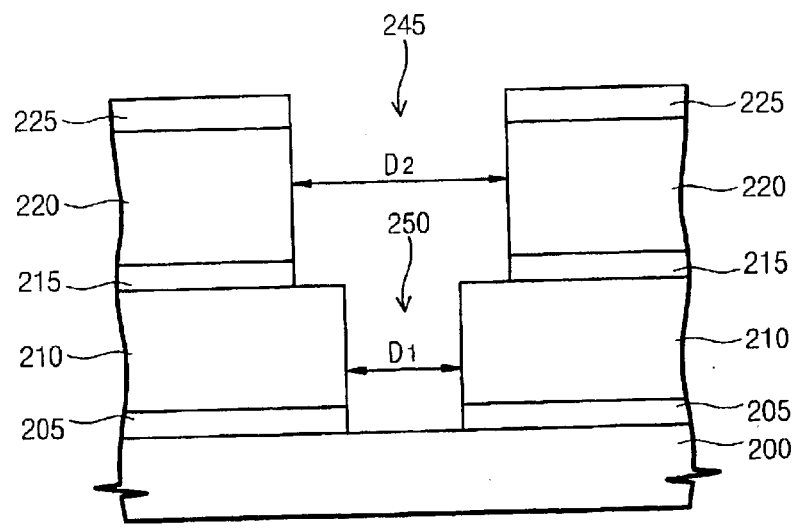
Figure 2J:
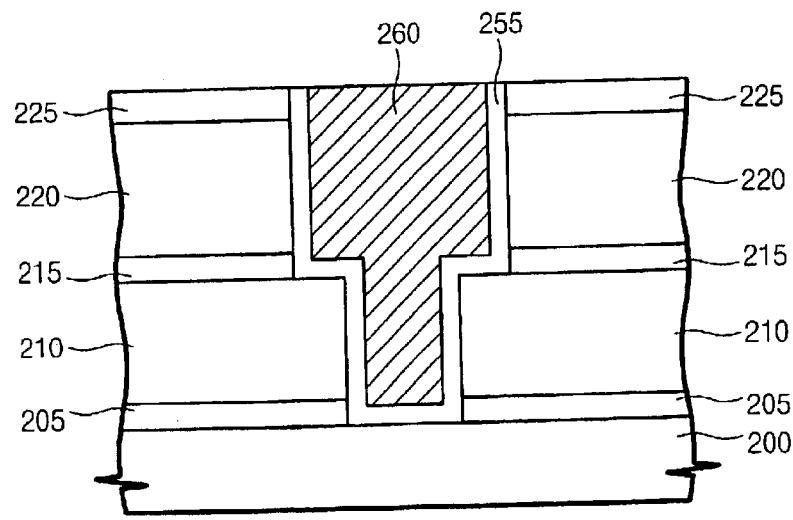

In the conventional art, the opening 347 is formed by a photoresist pattern having the width of the eventual via hole (see FIG. 2D). In contrast, in the present invention, the opening 347 is formed according to a photoresist pattern that is wider than the via hole to surmount the limit size of the photolithographic process. That is, in the direction across the interconnection groove 335 (x-direction), a via hole that is smaller than the resolution limit of the photolithographic process may be formed by the pre-formed spacer 340. In the interconnection groove direction (y-direction), the margin of the photolithographic process may be secured because the opening 347 may be formed to be wide in the x-direction. To form one via hole in one interconnection groove, the opening 347 may be opened (see the middle opening of FIG. 4C). In the event that a plurality of via holes are formed at a plurality of adjacent interconnection grooves respectively, one opening (see the upper and lower openings 347 of FIG. 4C) crossing the plurality of corresponding interconnection grooves may be formed. That is to say, while one via hole is formed at one photoresist pattern opening having the via hole width in the conventional approach, a plurality of via holes can be formed by a single photoresist pattern opening that is wider than the resulting via hole width in the present invention. By forming a plurality of via holes at one opening in the photoresist pattern, the margin of the photolithographic process becomes wider. Referring back to FIG. 3E, this figure is a cross-sectional view taken along a line I–I' of FIG. 4C, which shows the case where one opening 347 in the photoresist pattern is formed across three adjacent interconnection grooves. Namely, three via holes may be formed by one opening in the photoresist pattern crossing three interconnection grooves.

Figure 3F:
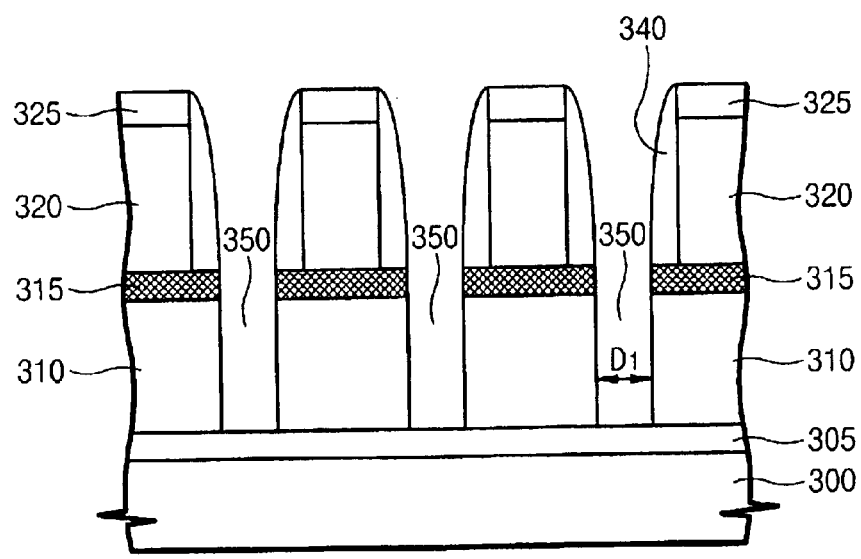

Referring to FIG. 3F, using the photoresist pattern 345, the spacer 340, and the hard mask layer 325 as an etching mask, the upper etch-stop layer 315 exposed by the opening 347 is selectively etched to expose the lower insulating layer 310. As previously described, since the etch rate, or etch selectivity, of the spacer 340 and the hard mask layer 325 is different from that of the upper etch-stop layer 315, they can be used as an etching mask.

Using the patterned hard mask layer 325, the upper etch-stop layer 315, the spacer 340 as an etching mask, the exposed lower insulating layer 310 is selectively etched down to a top surface of the lower etch-stop layer 305 to form a via hole 350 in the lower insulating layer 310. Note that in the case where the lower insulating layer 310 is made of organic polymer, the photoresist pattern 345 is removed while etching the exposed lower insulating layer 310.

Figure 4D:
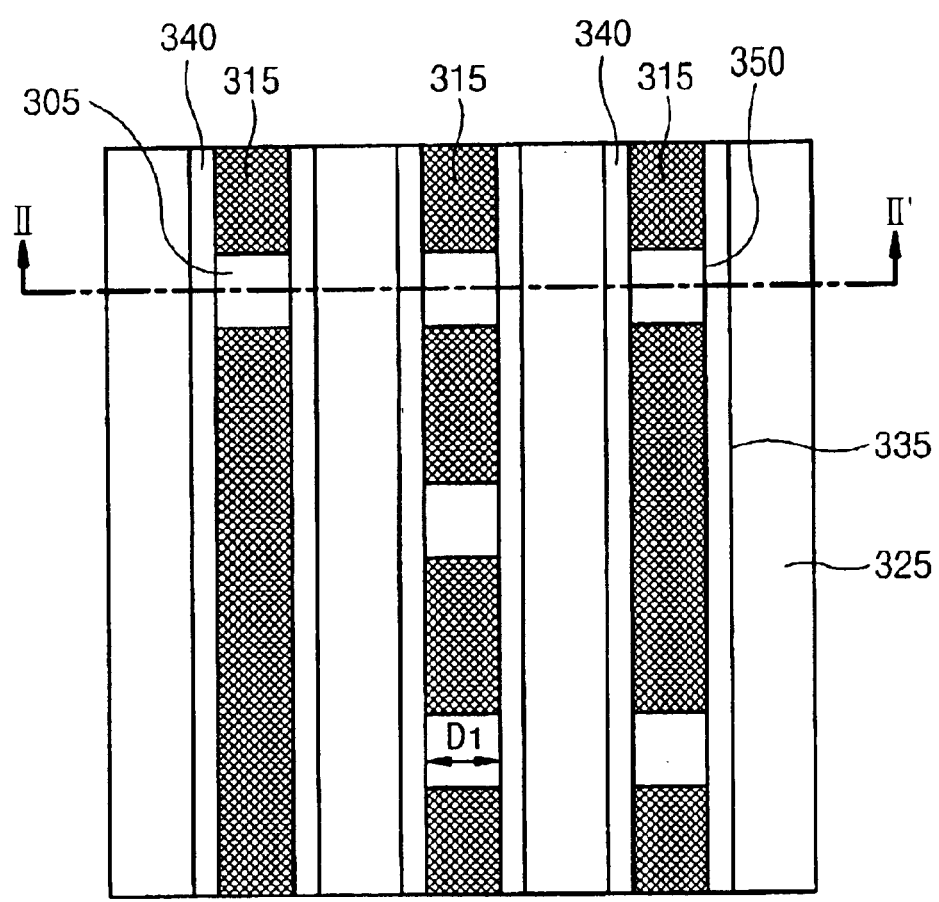

Referring to FIG. 4D, after the upper etch-stop layer 315 is patterned using the photoresist pattern 345 as an etching mask, a hole 350 exposing the lower etch-stop layer 305 is formed using the patterned etch-stop layer 315, the hard mask layer 325, and the spacer 340 as an etching mask. FIG. 3F is a cross-sectional view taken along a line II–II' of FIG. 4D.

Figure 3G:
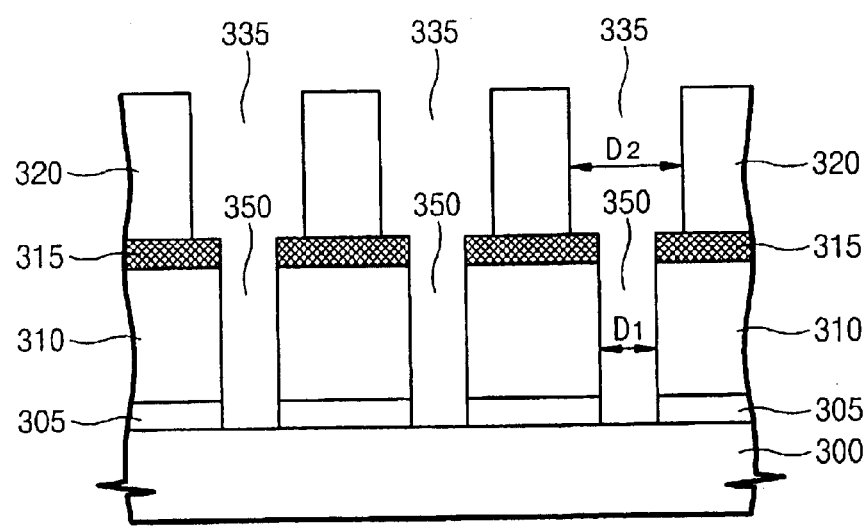

Referring to FIG. 3G, the hard mask layer 325, the spacer 340, and the lower etch-stop layer 305 below the via hole 350 are removed, for example, simultaneously, to form a damascene pattern comprising an interconnection groove 335 and a via hole 350. Since the removed layers may be all formed of a material having the same etch rate, e.g., silicon nitride, they may be removed at the same time.

For the removal process, a dry or wet etch technique may be used. In the case where a dry etch technique is used, a portion of the spacer 340 is not removed, and therefore remains, at the sidewall of the interconnection groove. In the illustration of FIG. 3G, they are all removed.

Figure 4E:
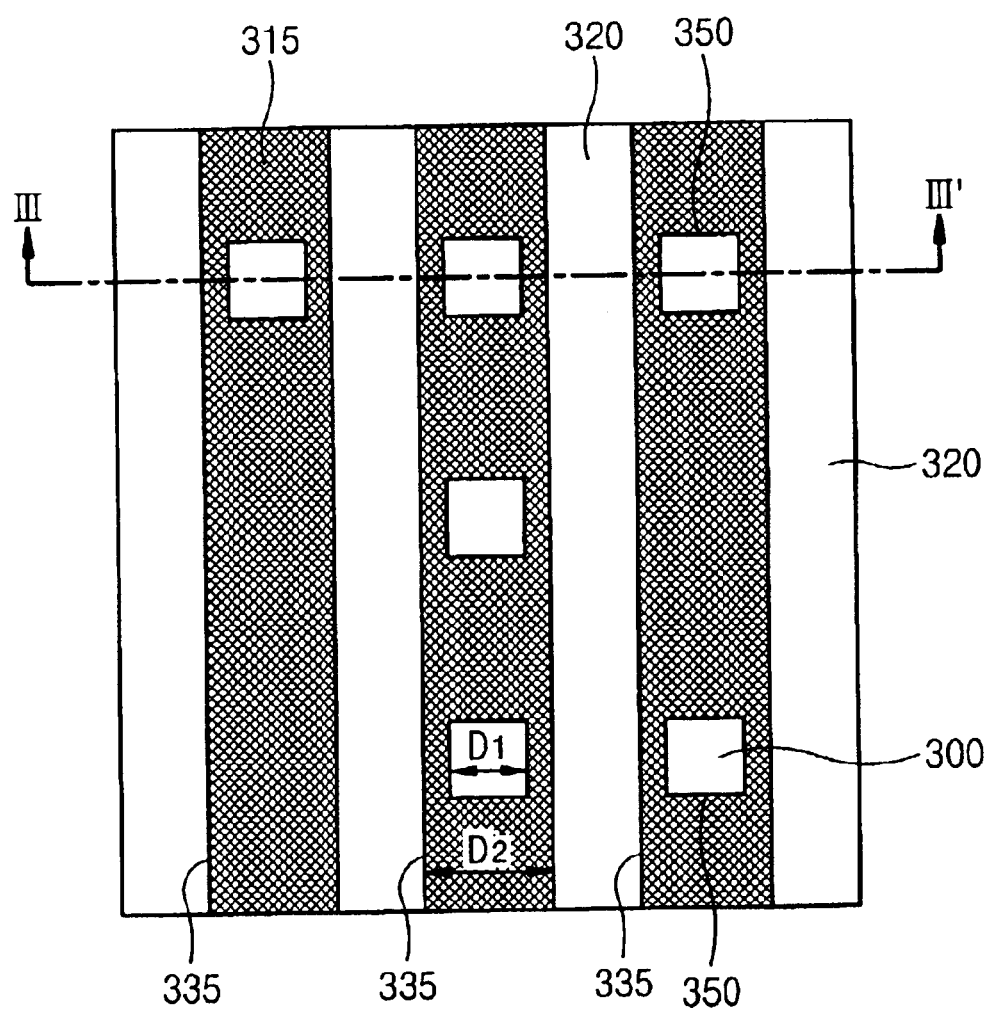

Referring to FIG. 4E, the hard mask layer 325, the spacer 340, and the exposed lower etch-stop layer 305 are removed. As a result, the interconnection 335 is formed in the upper insulating layer 320 and the via hole 350 connected to the lower conductive layer 300 is formed at the interconnection groove 335. FIG. 3G is a cross-sectional view taken along a line III–III' of FIG. 4E.

Figure 3H:
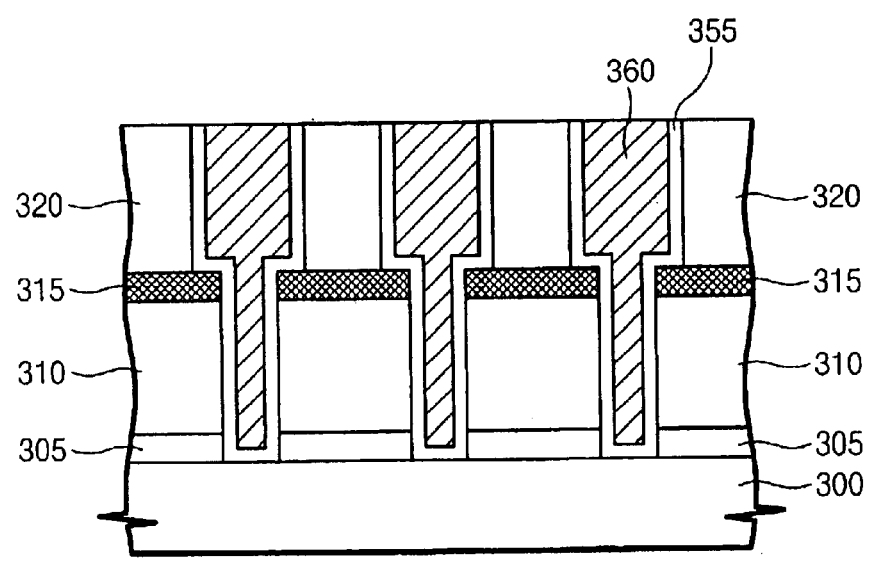

Referring to FIG. 3H, after filling the interconnection groove 335 and the via hole 350 with a conductive material, a planarization process is carried out to form an interconnection 360.

The conductive material is, for example, at least one material selected from the group consisting of aluminum (Al), aluminum alloy (Al-alloy), copper (Cu), gold (Au), silver (Ag), tungsten (W), and molybdenum (Mo). Further, the conductive material may be formed using a process selected from the group consisting of a reflow technique for a layer formed by sputtering the conductive material, a chemical vapor deposition (CVD) technique, an electroplating technique and so forth. In the case where the electroplating technique is used, a seed layer is required so that current can flow during electrolyzing.

Prior to formation of the conductive material, a barrier metal layer 355 may be formed. Particularly, in a case where copper (Cu) is used in the damascene process, the barrier metal layer is used to prevent the insulating characteristic of an interlayer dielectric from becoming deteriorated by diffusion of the conductive material, i.e., Cu. The barrier metal layer may be formed of a material selected from the group consisting of Ta, TaN, WN, TaC, TiSiN, and TaSiN. Further, the barrier metal layer may be formed using a process selected from the group consisting of a physical vapor deposition (PVD) technique, a chemical vapor deposition (CVD) technique, and an atomic layer deposition (ALD) technique.

While this invention has been particularly shown and described with references to preferred embodiments thereof, it will be understood by those skilled in the art that various changes in form and detail may be made herein without departing from the spirit and scope of the invention as defined by the appended claims.

What is claimed is:

1. A method of forming a dual damascene interconnection, comprising:

sequentially forming a lower insulating layer, an upper etch-stop layer, an upper insulating layer, and a hard mask layer on a semiconductor substrate where a lower conductive layer is formed;

patterning the hard mask layer and the upper insulating layer to form an interconnection groove in the upper insulating layer, the interconnection groove exposing a portion of the upper etch-stop layer;

forming a spacer on a sidewall of the interconnection groove;

forming a photoresist pattern having an opening that exposes the interconnection groove and the portion of the upper etch-stop layer;

successively etching the upper etch-stop layer and the lower insulating layer to form a hole in the lower insulating layer, the hole exposing a portion of the lower conductive layer;

removing the patterned hard mask layer and the spacer; and forming an interconnection to fill the interconnection groove and the hole.

2. The method as claimed in claim 1, wherein the lower and upper insulating layers comprise a low-k dielectric organic polymer.

3. The method as claimed in claim 1, wherein the lower and upper insulating layers comprise a material selected from the group consisting of fluorine-doped oxide, carbon-doped oxide, and silicon oxide.

4. The method as claimed in claim 1, wherein the hard mask layer comprises a material having an etch rate that is identical to that of the spacer, but is different from that of the upper etch-stop layer.

5. The method as claimed in claim 4, wherein the hard mask layer and the spacer comprise silicon nitride and the upper etch-stop layer comprises silicon oxide.

6. The method as claimed in claim 1, further comprising forming a lower etch-stop layer on the lower conductive layer, wherein the lower etch-stop layer is removed while removing the patterned hard mask layer and the spacer.

7. The method as claimed in claim 6, wherein the lower etch-stop layer comprises a material having an etch rate that is identical to that of the hard mask layer.

8. The method as claimed in claim 1, wherein forming the interconnection groove comprises:

forming a photoresist pattern on the hard mask layer, the photoresist pattern exposing a portion of the hard mask layer;

using the photoresist pattern as an etching mask, etching the exposed hard mask layer to form a hard mask layer pattern exposing a portion of the upper insulating layer; and using the hard mask layer pattern as an etching mask, etching the exposed upper insulating layer to expose the portion of the upper etch-stop layer, wherein the photoresist pattern is removed while etching the exposed upper insulating layer.

9. The method as claimed in claim 1, wherein the forming the hole comprises:

selectively etching the upper etch-stop layer exposed by the opening to expose a portion of the lower insulating layer; and using the patterned hard mask layer, the spacer, and the upper etch-stop layer as an etching mask, selectively etching the exposed lower insulating layer to expose the portion of the lower conductive layer, wherein the photoresist pattern is removed while etching the exposed lower insulating layer.

10. The method as claimed in claim 1, wherein the opening is formed have a first width in an interconnection groove direction that is larger than a second width in a direction crossing the interconnection groove.

11. The method as claimed in claim 1, wherein the opening exposes a plurality of interconnection grooves.

12. The method as claimed in claim 1, wherein the interconnection is formed of a conductive material that is one selected from the group consisting of aluminum (Al), aluminum alloy (Al-alloy), copper (Cu), gold (Au), silver (Ag), tungsten (W), and molybdenum (Mo).

13. The method as claimed in claim 1, wherein a barrier metal layer is formed prior to formation of the interconnection.

14. The method as claimed in claim 13, wherein the barrier metal layer is one selected from the group consisting of Ta, TaN, TiN, WN, TaC, WC, TiSiN, and TaSiN.

15. The method as claimed in claim 1, wherein the lower conductive layer is a lower interconnection formed on the semiconductor substrate and the hole is a via hole.

16. The method as claimed in claim 1, wherein the lower conductive layer is formed on a semiconductor substrate and the hole is a contact hole.

* * * * *